United States Patent [19]

Matsuura et al.

[11] 4,392,249

[45] Jul. 5, 1983

[54] ELECTRONIC CHANNEL SELECTION APPARATUS WITH SURFACE ACOUSTIC WAVE DEVICE

[75] Inventors: Shigeo Matsuura; Ikuo Yuki, both of Yokohama, Japan

[73] Assignee: Hitachi, Ltd., Tokyo, Japan

[21] Appl. No.: 247,268

[22] Filed: Mar. 25, 1981

[30] Foreign Application Priority Data

Mar. 25, 1980 [JP] Japan .................. 55-36867

[51] Int. Cl.³ .................. H04B 1/26; H03J 7/28; H03J 7/26
[52] U.S. Cl. .................. 455/164; 358/193.1; 358/195.1; 455/182
[58] Field of Search .......... 455/161, 164, 168, 169, 455/182, 184, 185; 358/191.1, 193.1, 195.1

[56] References Cited

U.S. PATENT DOCUMENTS

3,864,636  2/1975  Fukuda .................. 455/164
3,962,640  6/1976  Bomba .................. 455/182
3,988,681  10/1976  Schürmann .................. 455/161
4,232,397  11/1980  Murata et al. .................. 455/179

OTHER PUBLICATIONS

Acoustic Surface Wave Filter for TV Tuning Circuits—Grice et al., IBM Tech. Disc. Bulletin, vol. 19, No. 3, Aug. 1976, pp. 971-974.

*Primary Examiner*—Marc E. Bookbinder
*Attorney, Agent, or Firm*—Antonelli, Terry & Wands

[57] ABSTRACT

There is disclosed an electronic selection apparatus comprising a surface acoustic wave comb filter, in which the local oscillator frequency of an electronic tuner is swept up to a frequency higher than a peak frequency of the surface acoustic comb filter corresponding to a desired channel number (an upward direction), and then swept toward the opposite direction (a downward direction) until a predetermined number of peaks of the comb filter is counted while checking the presence of an AFC signal, whereby an erroneous tuning operation may be prevented, provided that the signal of the desired channel is present within a predetermined range in the vicinity of the receiving frequency of the desired channel.

6 Claims, 9 Drawing Figures

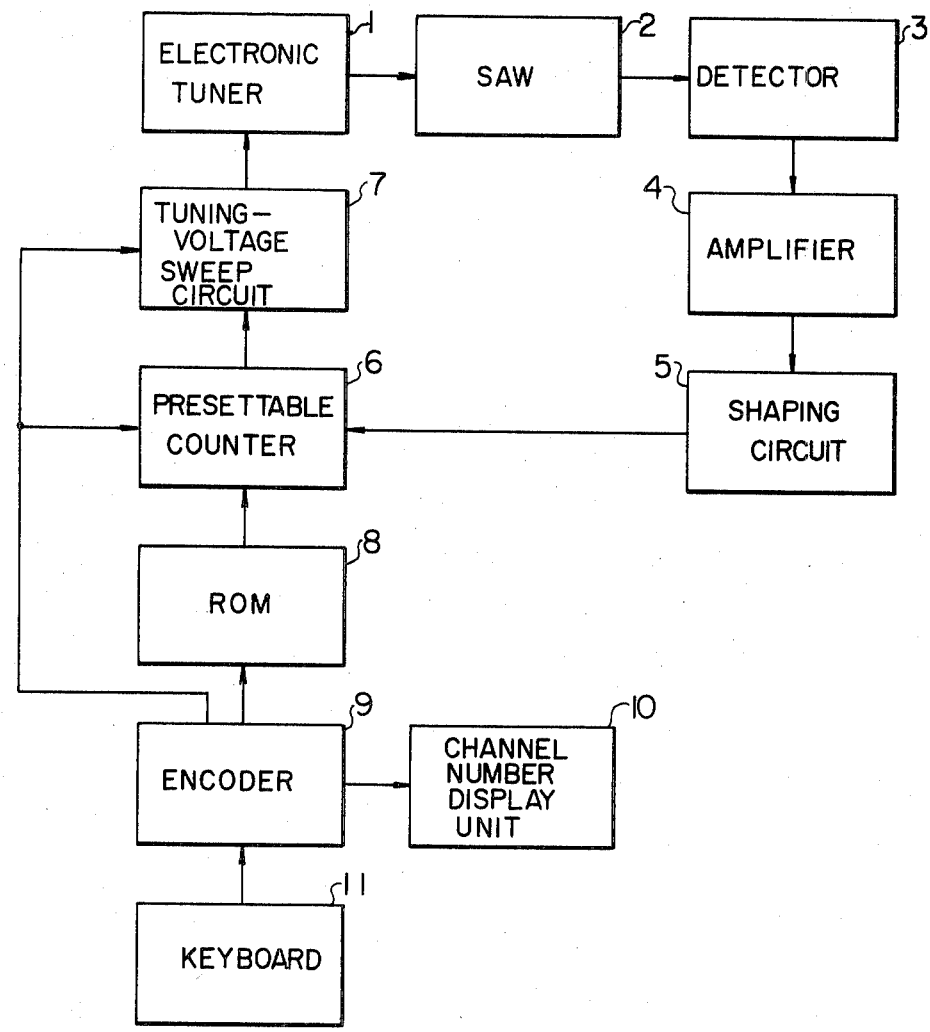
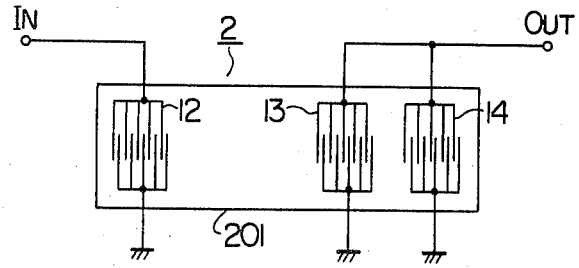

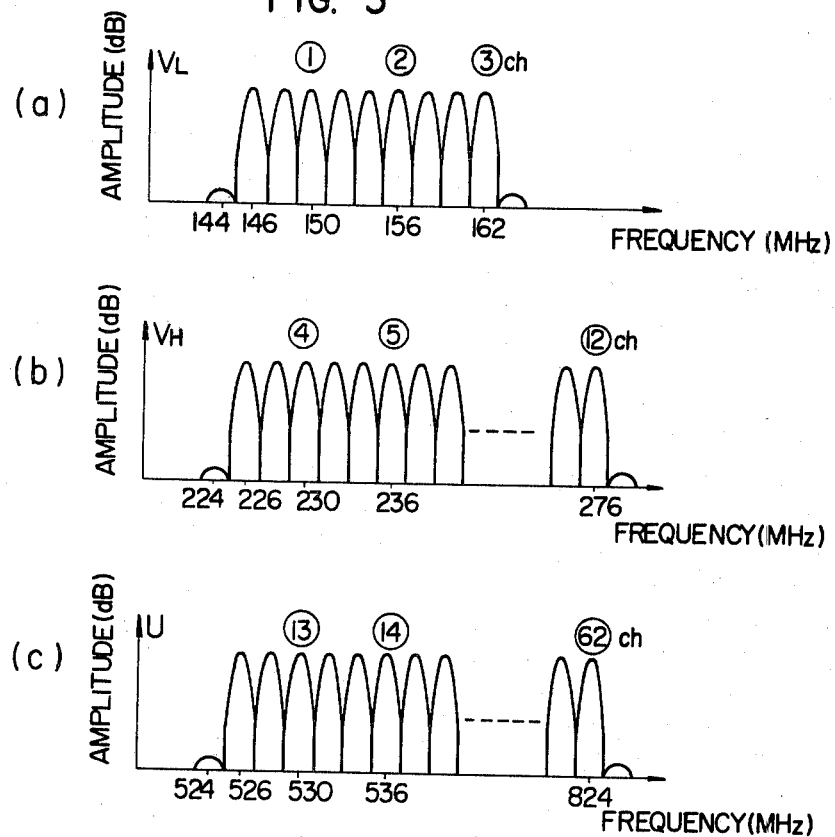
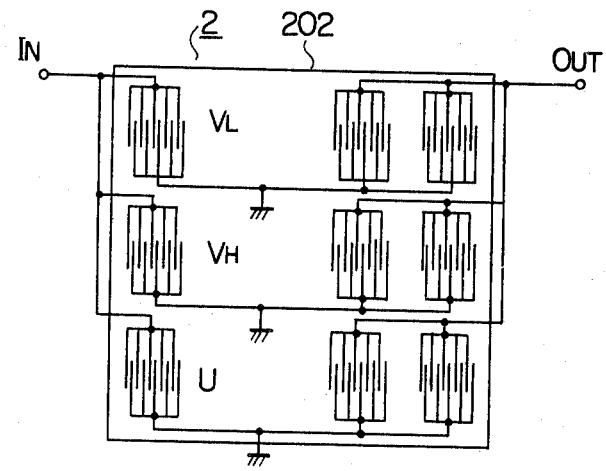

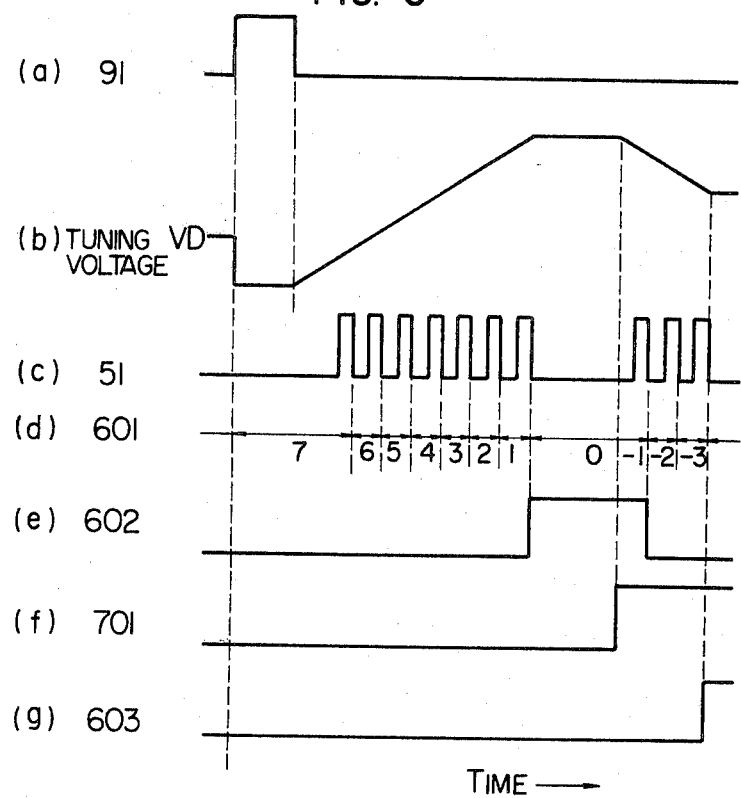
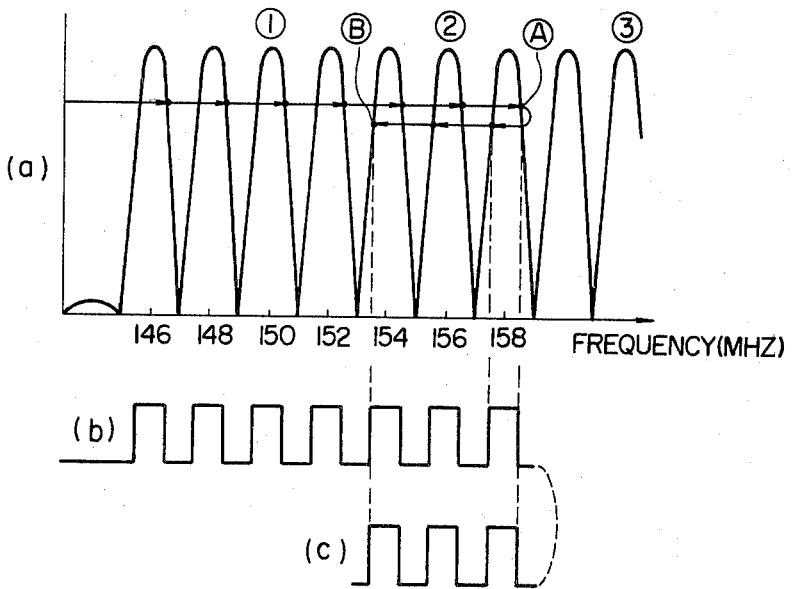

ELECTRONIC CHANNEL SELECTION APPARATUS WITH SURFACE ACOUSTIC WAVE DEVICE

This invention relates to an electronic channel selection apparatus for television receivers or the like, and more particularly to an electronic channel selection apparatus with a surface acoustic wave filter.

Recently, with the development of a variable capacitance diode and the like which are capable of controlling a reactance by an electric control signal, there is a trend of extensively using a so-called electronic tuner employing these elements as constituent elements of the tuning circuit in which the tuning operation can be executed in accordance with an electric signal. With such an electronic tuner, the tuning operation can be executed by merely changing the control voltage, so that it is easily possible to automatically select an electromagnetic wave transmitted from a desired broadcast station, i.e., automatically select stations. There are various well known electronic channel selection systems, and among them there is an electronic channel selection apparatus which is provided with a surface acoustic wave device (hereinafter referred to as SAW).

BRIEF DESCRIPTION OF THE DRAWINGS

The objects, features and advantages of the present invention will become apparent from the following detailed description of preferred embodiments thereof taken in conjunction with the accompanying drawings, in which:

FIG. 1 shows a block diagram showing a prior art electronic channel selection apparatus with a SAW;

FIG. 2 shows a view for illustrating the principle of the SAW;

FIG. 3 shows frequency band-pass characteristics of the SAW;

FIG. 4 is a diagram showing the electrode arrangement of the SAW used for an electronic channel selection apparatus of a television receiver tuner;

FIG. 6 is a time chart showing signals appearing at various parts of the electronic channel selection apparatus according to the invention for illustrating the operation thereof;

FIG. 7 is a schematic diagram for illustrating the operation of the electronic channel selection according to the invention;

Figure 5:
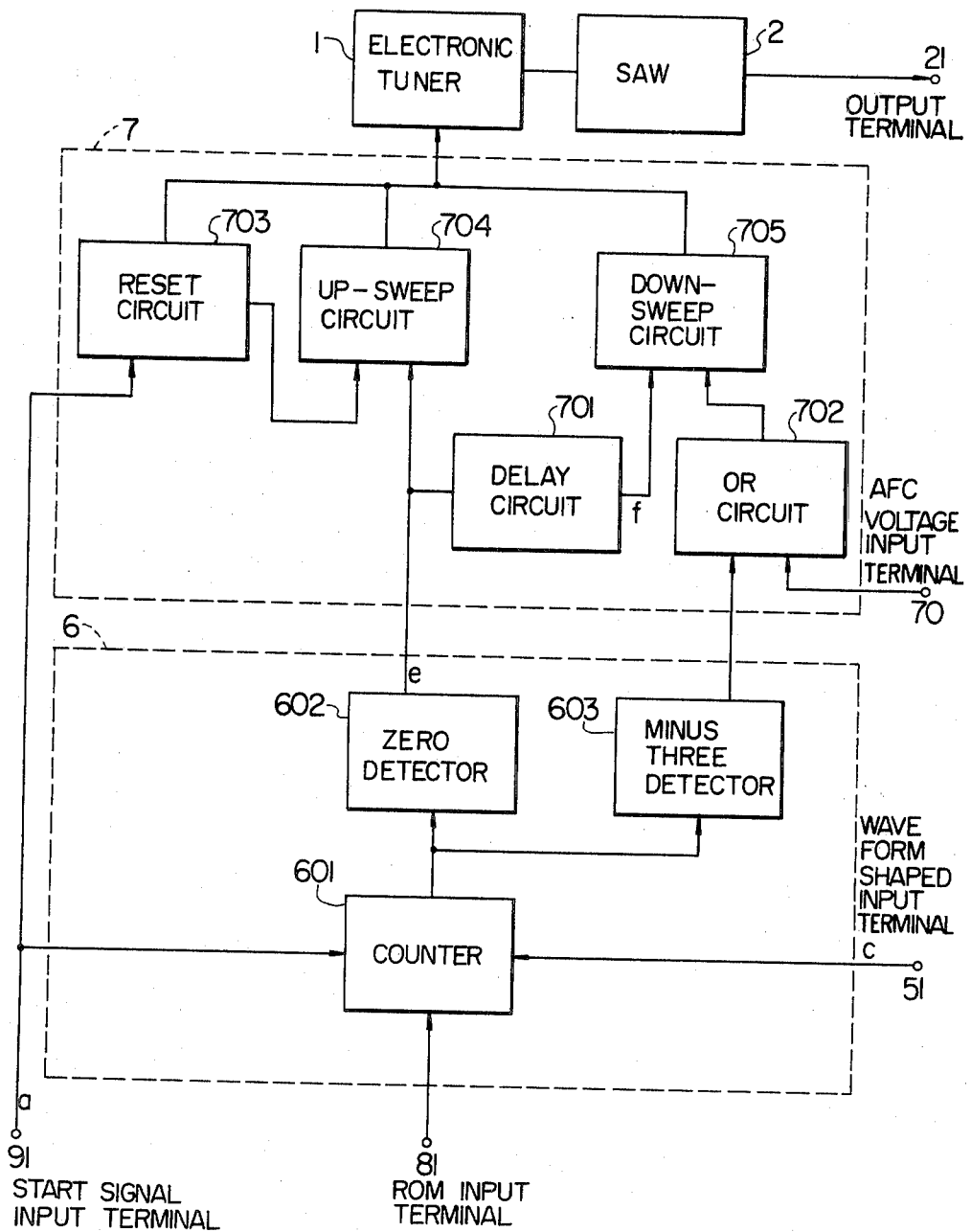
FIG. 5 is a block diagram showing the essential part of an embodiment of the invention.

A prior art example of the electronic channel selection apparatus with the SAW will now be described with reference to FIG. 1. Reference numeral 1 designates an electronic tuner, 2 a SAW (which will be described later in detail), 3 a detector, 4 an amplifier, 5 a shaping circuit, 6 presettable counter, 7 a tuning voltage sweep circuit, 8 a ROM, 9 an encoder, 10 a channel number display unit, and 11 a keyboard.

Prior to describing the operation of this electronic selection apparatus, the SAW 2 will first be described with reference to FIG. 2. FIG. 2 shows a view for illustrating the principle of the SAW. As is shown, the SAW 2 comprises a substrate 201 of a piezoelectric material such as LiNbO$_3$ or LiTaO$_3$, on which an input electrode 12 and two output electrodes 13 and 14 spaced apart at predetermined intervals from the input electrode 12 are provided. The individual electrodes 12, 13 and 14 are composed of an interdigital transducer, for instance. When a local oscillator signal from an input terminal IN is supplied with the input electrode 12, it is converted into a surface acoustic wave by the piezoelectric effect of the substrate 201. The surface acoustic wave is propagated along the surface of the substrate 201 to reach the output electrodes 13 and 14 where it is converted by the piezoelectric effect to an electric signal taken out from an output terminal OUT. The output electrodes 13 and 14 are spaced apart by a predetermined distance, that is, they are disposed at the respective different distances from the input electrode 12, so that there is produced a phase difference between the signals from these electrodes 13 and 14 due to the difference in the propagation period of time. Denoting the output signals from the electrodes 13 and 14 respectively by V$_1$ and V$_2$, the respective output signals are expressed as $$V_1 = Ae^{j\omega t}$$

and $$V_2 = Ae^{j\omega(t-\tau)}$$

where $\omega = 2\pi f$ (f being the frequency), and $\tau$ is the period of time required for the propagation of the surface acoustic wave from the electrode 13 to the electrode 14. Since the electrodes 13 and 14 are connected in parallel, the signal V taken out from the output terminal OUT is $$V = V_1 + V_2 = Ae^{j\omega t} + Ae^{j\omega(t-\tau)}$$

and its amplitude |V| is $$|V| = A|e^{j\omega t} + e^{j\omega(t-\tau)}| = A\sqrt{2(1+\cos\omega t)}$$

The value of |V| becomes maximum when $\omega = 2N\pi/\tau$, i.e., when $f = N/\tau$, and at this time ist magnitude is 2A. When $\omega = (2N+1)\pi/\tau$, i.e., when $f = (N+\frac{1}{2})/\tau$, it is minimum, and at this time it is 0. Denoting the frequency interval over which it is maximum by $\Delta f$, $$\Delta f = \frac{N+1}{\tau} - \frac{N}{\tau} = \frac{1}{\tau}$$

Since $\tau$ is constant so long as the SAW is the same, $\Delta f$ is also constant.

Considering now the tuner local oscillator frequencies for the individual television broadcast channels, in Japan they are classed into three bands, namely the VHF low band (channels "1" through "3") of 150 to 162 MHz, the VHF high band (channels "4" through "12") of 230 to 276 MHz and the UHF band (channels "13" through "62") of 530 to 824 MHz.

When the SAW 2 is selected such that its pass band covers an extra 4 MHz interval below each of the aforementioned three bands and $\tau$ is set to $\tau = \frac{1}{2}$ μsec., a comb filter characteristic as shown in (a), (b) and (c) in FIG. 3 is obtained.

It is difficult to obtain the above comb filter characteristic with a single SAW, so that three sets of electrodes may be provided in parallel on a single substrate 202 as shown in FIG. 4. Here, the individual surface acoustic wave devices (SAWs) are merely connected in parallel without agency of any switching means. The above parallel connection can be done because the pass-bands of the individual SAWs do not overlap and also these SAWs offer practically infinite impedance with respect to signals outside the pass-band so that there is practically no possibility of their interference with one another.

FIG. 3 shows the amplitude characteristic of local oscillator signal passed through the SAW 2. In FIG. 3, labeled (1), (2), . . . , (62) are the respective channel numbers, and the amplitude for, for instance, the channel "1" labeled (1) corresponds to the amplitude of the local oscillator signal for channel "1". The amplitude of signal passed through the SAW 2 is shown in decibels. It will thus be understood that the amplitude characteristic shown in FIG. 3 is the comb filter peak characteristic of the SAW 2.

For selecting a channel to be tuned in or switching channels, the channel number to be selected is given to the keyboard switch 11 by operating this switch. The channel number thus selected is transferred from the keyboard switch 11 to the encoder 9 for encoding the channel number into a binary code which is transferred to the ROM 8. At the same time, the channel number code is transferred to a channel number display unit 10, which may be a numeral display including LEDs (light-emitting diodes), whereby the selected channel number is displayed.

With the selected channel number provided and transferred to the encoder 9 by the operation of the keyboard switch 11, the encoder 9 provides a start signal to cause the tuning voltage sweeping operation of the tuning voltage sweep circuit 7. As a result, the local oscillator frequency of the tuner 1 and also the tuning frequency are progressively increased.

Meanwhile, the start signal provided from the encoder 9 is also coupled to a presettable counter 6, whereupon the output signal from the ROM 8 is preset in the presettable counter 6. Now, the operation of the ROM 8 will be described. The binary code representing the channel number, transferred to the ROM 8, determines the address of the ROM 8, and the data stored in that address is outputted. In each address, the number of SAW comb filter peaks corresponding to each channel as shown in FIG. 3 is stored; for example, the number "3" is stored for channel "1", "6" for channel "2", and "9" for channel "3". Thus, when the channel "3" is selected by the keyboard switch 11, the number "9" is preset in the presettable counter 6.

Since the local oscillator signal of the electronic tuner 1 is also coupled to the SAW 2, with increase of the local oscillator signal frequency the output frequency of the SAW 2 is increased as is seen from the characteristic of FIG. 3. The local oscillator signal output passed through the SAW 2 goes to a peak at a frequency of, for instance, 146 MHz, attenuated to zero at 147 MHz and again goes to a peak at 148 MHz, that is, the local oscillator signal output appears at the output of SAW 2 every time its frequency is increased by 2 MHz. The detector 3 detects the output of the SAW 2, and its detection signal greatly varies in level as the local oscillator frequency is increased. Thus, it is possible to count the number of times when the output of the SAW 2 reaches a peak level, and this number corresponds to the number of times the local oscillator frequency is increased by 2 MHz after the reaching of 146 MHz.

Accordingly, the output of the detector 3 is amplified through the amplifier 4 to a predetermined level and then shaped through the shaping circuit 5 into a pulse form. Thus, the shaping circuit 5 produces pulses corresponding in number to the electronic tuner local oscillator frequency.

This pulse signal is transferred to the presettable counter 6 for causing down-counting from an initial value corresponding to the channel number which is transferred from the keyboard switch 11 through the encoder 9 and ROM 8 to the counter 6. When the data in the counter 6 is reduced to zero, a stop signal is delivered to the tuning voltage sweep circuit 7 to stop the sweeping operation, and the voltage at this time is held. In this way, the desired channel is selected.

For example, when channel number "3" is inputted from the keyboard switch 11, the number "9" is preset-ted in the presettable counter; when the local oscillator frequency reaches 146 MHz, a pulse is inputted to the counter 6 to reduce the counter data to "8"; when the local oscillator frequency reaches 148 MHz, the counter data is reduced to "7"; when the local oscillator frequency reaches 162 MHz, the counter data is reduced to "0", whereupon the stop signal is delivered to the tuning voltage sweep circuit 7 to stop the sweeping operation and hold the prevailing voltage. In this way, channel "3" is selected.

Actually, in the tuning operation of the electronic tuner 1 it is difficult to cover the VHF low and high bands and UHF band as a single continuous band coverage, so these bands are separately covered, that is, the local oscillator signal is adapted to vary in a range of 100 to 170 MHz for the VHF low band, in a range of 200 to 300 MHz for the VHF high band and in a range of 500 to 1000 MHz in a UHF band. While the tuning voltage sweep circuit 7 is caused to start the sweeping by the start signal at the time of the channel selection, it is of course necessary that the tuning voltage be reset to a sufficiently low voltage for the sweeping in order to be able to count the local oscillator signal outputs from the SAW comb filter. Also, for stopping the sweeping and holding the voltage, it is in practice to use a method of always maintaining the optimum reception state through detection of the AFC voltage. Further, at the time of the tuning voltage sweeping, the AGC voltage is applied to the electronic tuner for reducing the gain in order to avoid the selection of an erroneous channel due to generation of an unnecessary pulse with subtle change of the local oscillator frequency caused by a strong input signal.

With the electronic tuner of this apparatus, the tuning operation is newly executed every time the channel selection operation is carried out, so that as compared with system where tuning voltages are presetted and selectively supplied to the electronic tuner at the time of the tuning operation, the system according to the present invention can provide more accurate tuning without need of any adjustment for a long period of time. Owing to this advantage, this system has recently been widely adopted.

However, even where the tuning is made by the above operation, deviation from a predetermined frequency is liable to result due to inferior precision of the frequency corresponding to a peak of the SAW comb filter or due to temperature changes, and in such a case the desired broadcast channel cannot be selected by the voltage obtained at the time when the sweeping operation is stopped. While an AFC circuit may be added to prevent this, it is conceivable that there results frequency deviation beyond the pull-in frequency range of the AFC. Further, in the case of VTR or game machine, it is likely that the carrier frequency itself is deviated, and in such a case erroneous operation will occur.

This invention is intended to provide the solution of the afore-mentioned problems inherent in the prior art electronic channel selection apparatus, and its object is to provide an electronic channel selection apparatus, with which the desired channel can be reliably selected without any erroneous operation even when there is a deviation of the frequency corresponding to a peak of the SAW or the carrier frequency from the VTR or game machine provided the deviation is within a predetermined range.

To achieve the above subject, according to the invention the frequency sweeping in an electronic channel selection apparatus of the type mentioned above is first made in the upward direction up to a frequency higher than the SAW peak frequency corresponding to each channel number and then made in the opposite direction (i.e., downward direction) while checking for any signal until the count of a predetermined number of peaks is obtained for tuning in a signal within a predetermined range near each channel reception frequency. The reason for first sweeping upwards to a frequency higher than the SAW peak frequency corresponding to each channel number instead of sweeping upwards to that frequency while checking for signal is that in the latter case the audio carrier frequency adjacent to the lower side of the desired channel is liable to be pulled in at the time of the tuning and in such a case the desired channel can no longer be tuned in.

Now, an embodiment of the electronic channel selection apparatus according to the invention will be described in detail with reference to the accompanying drawings.

FIG. 5 shows a block diagram of the essential part of an embodiment of the electronic tuning apparatus according to the invention. Here, portions corresponding to the presettable counter 6 and tuning voltage sweep circuit 7 in FIG. 1 are shown in further detailed block form, and the reset of the circuit is the same as shown in FIG. 1. However, the SAW 2 in this embodiment has a characteristic slightly different from that shown in FIG. 3 such that at least two peaks are obtained on the higher frequency side of the peaks corresponding to the highest channels "3", "12" and "62" in the individual bands. In FIG. 5, reference numeral 601 designates a counter, 602 a zero detector for detecting zero counter data, 603 a minus three detector for detecting "−3" as the counter data, 701 a delay circuit for delaying the input pulse for a predetermined period of time, 702 an OR circuit, 703 a reset circuit for temporarily setting the tuning voltage to a sufficiently low voltage, 704 an up-sweep circuit for up-sweeping the tuning voltage, 705 a down-sweep circuit for down-sweeping the tuning voltage, 21 the output terminal of the SAW 2 which is connected to the detector 3 as shown in FIG. 1, 51 a waveform shaped input terminal, 81 a ROM signal input terminal to which the output of the ROM 8 is coupled, 91 a start signal input terminal to which the start signal output of the encoder 9 is coupled, and 70 an AFC voltage detection signal input terminal to which a detection signal is coupled when the AFC voltage becomes lower than a predetermined voltage.

FIG. 6 is a time chart for illustrating the operation timings of various component circuits in the circuit of FIG. 5. In operation, when a channel number is set by operating the keyboard switch, a start signal is inputted to the input terminal 91. This start signal has a predetermined pulse width as shown in (a) in FIG. 6. It is inputted to the reset circuit 703 to set the tuning voltage VD at a sufficiently low level as shown in (b) in FIG. 6. The output of the reset circuit 703 is inputted to the up-sweeping circuit 704, and the up-sweeping is started with the ending of the resetting. With the up-sweeping of the tuning voltage as shown in (b) of FIG. 6, the local oscillator frequency of the electronic tuner 1 is increased, and pulses corresponding in number to the number of peaks of the SAW 2 are outputted from the shaping circuit (as shown in (c) of FIG. 6). The start signal is also inputted to a preset terminal of the counter 601, so that the ROM data inputted to the terminal 81 is preset in the counter 601. As the ROM data, unlike the prior art, not the number of peaks up to the SAW peak frequency corresponding to each channel number but a data greater than that number by "1" is preset, for example, number "4" is preset for channel "1", "7" for channel "2" and "10" for channel "3". Taking now the case of selecting channel "2", number "7" is preset in the counter 601 as shown in (d) in FIG. 6. The pulses supplied to the input terminal 51 with the up-sweeping are inputted to the counter 601, and the counter 601 effects down-counting in response to the falling of each pulse. Thus, the counter data is reduced "1" by "1" in response to the falling of each input pulse as shown in (d) in FIG. 6, and when the data of the counter 601 reaches "0", the zero detector 602 detects it to deliver a pulse as shown in (e) in FIG. 6. The output of the zero detector is inputted to the up-sweeping circuit 704, whereby the up-sweeping is stopped.

The output of the zero detector 602 is also inputted to the delay circuit 701, which provides a pulse after a predetermined delay time as shown in (f) of FIG. 6. The output of the delay circuit 701 is inputted to the down-sweeping circuit 750, whereby the down-sweeping of the tuning voltage is started. During the down-sweeping, like the up-sweeping, pulses corresponding in number to the number of SAW peaks are supplied to the waveform shaped signal input terminal, and the counter 601 again effects down-counting in response to the falling of each input pulse. Thus, the count is successively changed to "−1", "−2", "−3".

If there is no broadcast wave in the selected channel, no AFC voltage change is detected, so that no signal is coupled to the AFC voltage input terminal 70, and the counter 601 continues down-counting. When the counter data reaches "−3", the minus three detector 603 detects it to provide an output (as shown in (g) in FIG. 6), which is coupled through the OR cicuit 702 to the down-sweep circuit 705, thus causing the circuit 705 to stop the down-sweeping and hold the prevailing tuning voltage.

If there are broadcast waves in the selected channel, a change of the AFC voltage is detected during the down-sweeping, and at this time the detection signal is coupled through the OR circuit 702 to the down-sweep circuit 705 so as to stop the down-sweeping. Subsequently, the tuning voltage can be compensated by the ordinary AFC action to tune in the desired channel.

The above operation is illustrated in (a) of FIG. 7 in terms of the frequency change due to the sweeping. If the duty radio of the output pulses of the shaping circuit 5 corresponding to SAW peaks is 50%, a pulse train as shown in (b) of FIG. 7 is obtained. In this pulse train, the center point in each high level period corresponds to a peak point of the SAW, and the frequencies at the rising and falling are spaced apart 500 MHz from the SAW peak respectively in the opposite directions. Of course the rising and falling occur for every 2 MHz.

When the pulse train obtained during the down-sweeping is down-counted in the counter 601, at a frequency Ⓐ shown in (a) of FIG. 7 the data of the counter 601 is reduced to "0", whereupon the up-sweeping is stopped, and after a predetermined period of time the down-sweeping is started. During the down-sweeping, a similar pulse train to that at the time of the up-sweeping is obtained as shown in (c) of FIG. 7, and the down-sweeping is stopped at a frequency Ⓑ shown in (a) of FIG. 7, at which the counter data reaches "−3". While in the frequency characteristic diagram of FIG. 7 it is shown that the pulse shaping is effected with respect to slightly different levels at the time of the up-sweeping and at the time of the down-sweeping, this is only for the sake of illustration, and usually the pulse shaping is effected at the same level.

It will be seen from (a) of FIG. 7 that while no broadcast wave is detected during the down-sweeping, the sweeping is made over a range between +2.5 MHz and −2.5 MHz for searching for broadcast waves. Thus, even if the SAW frequency or signal frequency is deviated, the broadcast wave can be received so long as the deviation is within ±2.5 MHz.

While in the above apparatus it is liable that the audio carrier wave of a television signal is received, this can be avoided by providing a sync detection circuit such as used in other prior art electronic channel selection apparatus.

Now, additional elements in the embodiment of FIG. 5 will be described. The start signal pulse coupled to the input terminal 91 is required to have a sufficient pulse width for ensuring that the tuning voltage is reset to a sufficiently low voltage and that the switching of reception bands is completely ended. This width is determined by a circuit within the encoder 9. The delay circuit 701 is provided for the following reason. As mentioned previously, the local oscillator frequency is subject to subtle changes due to a strong input signal appearing during the up-sweeping, so that an unnecessary pulse is generated to cause erroneous operation. To avoid this, during the up-sweeping the AGC voltage is applied to the electronic tuner 1 to reduce the gain. However, during the down-sweeping, during which time whether there is a broadcast wave is checked through the detection of a change of the AFC voltage, it is necessary to hold a sufficiently high gain of the electronic tuner. This means that the ordinary AGC voltage has to be recovered as soon as the up-sweeping is stopped. However, the capacitance inserted in the AGC circuit dictates some delay time until the recovery. Accordingly, the start of the down-sweeping has to be delayed until the ordinary AGC voltage is recovered, and the delay circuit 701 is provided to this end. The delay circuit may thus be omitted in a case where the afore-mentioned problem of erroneous operation is not posed.

Now, the specific construction of the individual component circuits shown in FIG. 5 will be described. The counter 601 may be a well-known presettable down-counter. The number of the stages of the counter is determined by the maximum value of the ROM data corresponding to the channel to be selected. For example, if the ROM data for channel "13" in Japan is "4", the ROM data for channel "62" is "151" (in case if the frequency interval between adjacent peaks of the SAW is 2 MHz). As the counter 601, an 8-stage binary counter is sufficient for it can count up to "255".

The zero detector 602 can be formed by a NOR circuit which receives the outputs of all the stages of the counter 601. With this construction, when the counter data is reduced "0", the NOR circuit output becomes "1". The minus three detector can be readily constituted when the number of stages of the counter 601 is determined. More particularly, when a further signal pulse is inputted after the data of the 8-stage counter 601 is reduced to "0", the data of the counter becomes "255". With the application of further pulses the counter data is changed to "254" and "253". Thus, the minus three detector may detect that three pulses are inputted after the detection of "0", that is, it may be constructed such that it detects the reaching of the counter data to "253". The decimal number "253" corresponds to the binary number "11111101", it is possible to use an AND circuit, which receives the inverted input at its second bit and non-inverted inputs at all the other bits.

Figure 8:
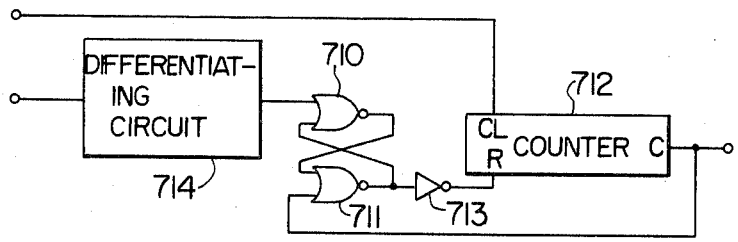
FIG. 8 is a circuit diagram for illustrating an example of the delay circuit used in accordance with the invention.

The relay circuit 701, is made clear in connection with FIG. 6, need not delay the input pulse wave directly for a predetermined period of time, but it may delay the rising of the pulse as shown in (e) of FIG. 6. While this circuit can be constructed with a mono-stable multi-vibrator, for instance, what is formed with a counter is preferred from the standpoint of the readiness of implementation with IC. FIG. 8 shows an example of this circuit. Reference numeral's 710 and 711 designate NOR circuits, 712 a counter with a reset terminal, 713 an inverter, and 714 a differentiating circuit. When the output of the zero detector 602 is coupled through the differentiating circuit 714 to the NOR circuit 710, which forms an RS flip-flop together with the NOR circuit 711, the output of the NOR circuit 711 becomes "1". As a result, the input to the reset terminal R of the counter 712 becomes "0", whereupon the counting of clock input to the clock input terminal CL is started. When the counting is progressed so that an output eventually appears from the carry output terminal C, it is inputted to the NOR circuit 711, causing the output of the NOR circuit 711 to become "0". As a result, the input to the reset terminal of the counter 712 is changed again to "1" to reset the counter. Thus, the period of time from the appearance of the output from the zero detector 602 till the appearance of the carry output is determined by the number of stages of the counter 712 and the period of the clock signal inputted to the counter. These parameters may be appropriately set such that a carry output is obtained after a predetermined period of time, and this output may be coupled to the down-sweeping circuit 705.

Figure 9:
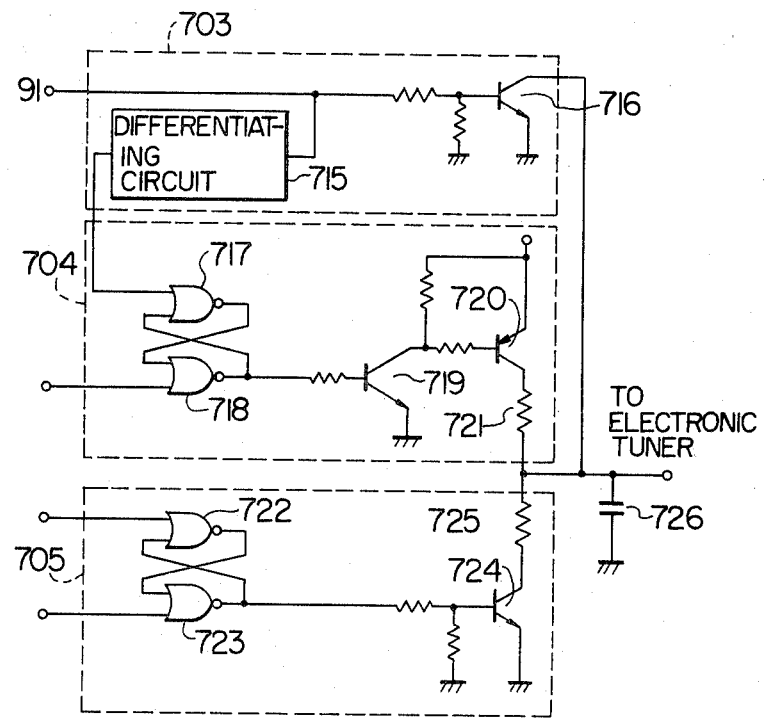
FIG. 9 is a circuit diagram for illustrating an example of a reset, an up-sweep and a down-sweep circuit.

Now, the reset circuit 703, up-sweeping circuit 704 and down-sweeing circuit 705 will be described in detail. FIG. 9 collectively shows examples of these circuits. Reference numeral 715 designates a differentiating circuit, 716, 719, 720 and 724 transistors, 717, 718, 722 and 729 NOR circuits, 721 and 725 resistors, and 726 a capacitor. When the start signal is inputted from the terminal 91 to the reset circuit 703, the transistor 716 is triggered to reduce the tuning voltage across the capacitor 726 practically to 0 V. When the start signal falls, the differentiating circuit 715 detects it to set the flip-flop formed by the NOR circuits 717 and 718. As a result, the output of the NOR circuit 718 becomes "1", thus triggering the transistor 719 to trigger the transistor 720. Since at this time the transistor 716 is "off", charging current is caused to flow through the resistor 721 into the capacitor 726 for the up-sweeping. When the zero detector 602 subsequently provides the output, which is inputted to the NOR circuit 718, the output thereof becomes "0" to cut off the transistors 719 and 720, thus stopping the up-sweeping.

Since the output of the zero detector 602 is also coupled through the delay circuit 701 to the NOR circuit 722, after the lapse of a predetermined period of time from the stopping of the up-sweeping the output of the NOR circuit 723 becomes "1" to trigger the transistor 724. As a result, the voltage across the capacitor 726 is discharged to cause the down-sweeping. With the subsequent appearance of the minus three detector 603 or AFC voltage detection signal, the output of the NOR 723 becomes "0" to stop the down-sweeping.

In a case where the AGC voltage is applied to the tuner for reducing the gain while the reset circuit and up-sweeping circuit are operative in order to prevent malfunction as mentioned previously, the start signal and the output signal of the NOR circuit 718 may be coupled through an OR circuit to the AGC terminal of the electronic tuner. In this case, the signal is of course inputted through a transistor in dependence upon the direction of the AGC voltage of the electronic tuner (i.e., whether the AGC is forward or reverse AGC), magnitude of the current required for the drive, etc.

Further, while the above embodiment has concerned with the case of coupling the channel number by operating the keyboard switch, since in an area the channels that can be received are limited in number to about eight channels, it will be clear that the sweep method according to the invention may be effectively applied to a case where about 12 channel selection buttons and a memory for storing a desired channel number are used in lieu of the keyboard switch so that desired channels can be selected by one-touch operation.

As has been described in the foregoing, since according to the invention the neighborhood of the receiving frequency of the selected channel is swept to search for signal, the desired channel can be reliably received even if there is a deviation of the SAW peak frequency or carrier frequency, provided that the deviation is within a predetermined range.

What is claimed is:

1. An electronic channel selection apparatus with a surface acoustic wave device comprising:
    (a) an electronic tuner including a voltage-controlled local oscillator which produces an output signal whose output frequency is variable in response to a control voltage for controlling the tuning frequency of the tuner;
    (b) a surface acoustic wave comb filter at the input terminal thereof connected to the output terminal of said local oscillator and producing an output having a comb-shape output characteristic including a plurality of output peaks which successively appear at predetermined frequencies;
    (c) an amplitude detector for detecting the output of said surface acoustic wave comb filter;
    (d) an amplifier for amplifying the output of said amplitude detector;
    (e) a shaping circuit connected to said amplifier for shaping the output waveform therefrom;
    (f) a presettable counter coupled to said shaping circuit for counting the number of times that the output level of said amplitude detector changes at the time of a frequency sweeping operation of said voltage-controlled local oscillator; and
    (g) a sweep circuit connected to said presettable counter for sweeping the control voltage of said local oscillator upwardly toward an upper level and then sweeping the control voltage downwardly toward a lower level while checking only during said downward sweep as to whether or not an AFC voltage detection sinal is present, thereby selecting a desired channel.

2. An electronic channel selection apparatus according to claim 1, wherein said sweep circuit includes means for sweeping up to an output frequency higher than the peak output frequency of said surface acoustic wave comb filter corresponding to a desired channel number and subsequently sweeping down to a peak output frequency lower than the peak output frequency of said surface acoustic wave comb filter corresponding to a desired channel number while checking as to whether said AFC voltage detection signal is present.

3. The electronic channel selection apparatus according to claim 1 or 2, wherein said sweep circuit further includes means for stopping all the sweeping for a constant period of time after the upward sweeping and before starting the downward sweeping.

4. The electronic channel selection apparatus according to claim 1, further comprising a memory for storing the number of times of the change of the output level of said amplitude detector corresponding to a desired channel number, means for setting the output of said memory as an initial value in said counter, a first detector circuit for detecting the reaching of a first specific value of the counter data of said counter, and a second detector circuit for detecting the reaching of a second specific value which is different from said first specific value of the count data of said counter, said counter down-counting the number of times of the change of the output level of said amplitude detector after the setting of the output of said memory as the initial value in said counter, said sweep circuit stopping the up-sweeping in response to occurrence of the output of said first detector and subsequently starting the down-sweeping while checking as to whether said AFC voltage detection signal is present and stopping the down-counting in response to occurrence of the output from said second detector.

5. The electronic channel selection apparatus according to claim 4, wherein said first specific value is set to "0", and said second specific value is set to be equal to or less than the maximum value of said counter.

6. The electronic channel selection apparatus according to claim 5, wherein said sweep circuit includes means for stopping the sweeping by receiving said AFC voltage detection signal and re-starting the sweeping in response to the non-detection of a synchronization signal.

* * * * *